United States Patent
Kersch et al.

(10) Patent No.: US 6,413,886 B1
(45) Date of Patent: Jul. 2, 2002

(54) METHOD FOR FABRICATING A MICROTECHNICAL STRUCTURE

(75) Inventors: Alfred Kersch, Putzbrunn; Georg Schulze-Icking, Ottobrunn, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/636,522

(22) Filed: Aug. 10, 2000

(51) Int. Cl.⁷ .................. H01L 21/31; H01L 21/469
(52) U.S. Cl. .................. 438/788; 438/665; 438/792
(58) Field of Search ................ 438/763, 788, 438/792, 665

(56) References Cited

U.S. PATENT DOCUMENTS

| | | | | |
|---|---|---|---|---|
| 5,858,464 A | * | 1/1999 | Littau et al. | 427/237 |
| 6,042,687 A | * | 3/2000 | Singh et al. | 156/345 |
| 6,261,957 B1 | * | 7/2000 | Jang et al. | 438/692 |

OTHER PUBLICATIONS

"Processing methods to fill high aspect ratio gaps without premature constriction"(Conti et al.), dated Feb. 8–9, 1999, pp. 201–209.

"Modeling of $SiO_2$ deposition in high density plasma reactors and comparisons of model predictions with experimental measurements" (Meeks et al.), dated Mar./Apr. 1998, American Vacuum Society, pp. 544–556.

* cited by examiner

Primary Examiner—Alexander G. Ghyka
(74) Attorney, Agent, or Firm—Laurence A. Greenberg; Werner H. Stemer; Ralph E. Locher

(57) ABSTRACT

The invention relates to a method for fabricating a microtechnical structure (28) having a depression (25), which has a high aspect ratio. In order to achieve a good filling behavior, it is proposed to increase the quantity of the passivating particles which are present in the reactor and passivate the surface of the structure (28) against further addition of the filling material (30). With suitable process control, the additional passivation has an effect essentially only on the side walls (27) of the depression (25).

15 Claims, 2 Drawing Sheets

METHOD FOR FABRICATING A MICROTECHNICAL STRUCTURE

BACKGROUND OF THE INVENTION

Filed of the Invention

The invention relates to a method for fabricating a microtechnical structure, in particular a microelectronic structure, in which a filling material is deposited in at least one depression in the structure in an HDP-CVD (High Density Plasma-Chemical Vapor Deposition) process. Depressions such as trenches or holes which are to be filled with a filling material in a later fabrication step are often produced in microtechnical structures. In order to fill the depressions, filling materials are deposited in deposition processes with a pronounced directional characteristic. With the continuously advancing miniaturization of microtechnical structures, it is necessary to fill depressions having larger and larger aspect ratios, that is to say ratios of the depth to the width of the depression.

A known process for depositing filling materials is the HDP-CVD process. FIG. 1 of the accompanying drawing shows a reactor 1 in which the HDP-CVD process can be carried out. By way of example, a wafer is introduced into a lower chamber 3 of the reactor 1 through an opening 7 and is positioned on a sample table 9. After the wafer 11 has been positioned on the sample table 9, the latter is moved vertically upward into the position illustrated in FIG. 1, in which the surface of the wafer 11 is arranged approximately at the lower edge of an upper chamber 13 of the reactor 1. The upper chamber 13 has an approximately rotationally symmetrical dome 15 around which the windings of an electromagnetic coil 17 are passed. A gas inlet 19 is provided on the upper chamber 13 in order to introduce gases that participate in the process into the reactor 1. A pump 5 serves for evacuating the interior space of the reactor 1. During the process, the gases introduced through the gas inlet 19 are permanently drawn off again by the pump 5, so that a continuous gas flow takes place. With regard to the concentration or partial pressures of the gases and their constituents in the interior space of the reactor 1, an approximately steady state is established during the process.

During the process, an electrical AC voltage having a frequency typically of 400 kHz is applied to the coil 17 (first frequency generator 21). This leads, in the upper chamber 13, to the production of a high-density plasma (typically $1\times10^{11}$–$1\times10^{12}$ ions/cm$^3$) in a plasma space 16. The boundary of the plasma space 16 extends at a distance along the surface of the wafer 11 and the reactor walls. On account of the higher mobility of the electrons in the plasma in comparison with the ions, the plasma is positively charged relative to its surroundings. In this case, the interior of the plasma is virtually free of electrical potential differences. If, on the other hand, ions enter the boundary layer of the plasma, they are accelerated out of the plasma due to electrical field forces. That corresponds to the so-called electrical boundary layer voltage.

In order to be able to control the boundary layer voltage at the boundary layer near the wafer 11 and in order to produce a larger boundary layer voltage there, a second electrical AC voltage is applied between ground potential and the sample table 9 (second frequency generator 23). The frequency of the second frequency generator 23 is significantly higher than the frequency of the first frequency generator 21, and is typically more than 10 Mhz. This high frequency has virtually no effect on the ion density of the plasma, so that the plasma density and the boundary layer voltage at the wafer 11 can be set virtually independently of one another.

The above-described reactor 1 and the corresponding HDP-CVD process are exemplary embodiments. HDP-CVD processes can also be performed in a similar manner in other reactors.

When filling depressions having high aspect ratios, care must be taken to ensure that the filling is effected from the bottom of the depression and only a small amount of filling material is deposited on the side walls of the depression. Undesirable voids are otherwise formed. It is known that during the HDP-CVD process, the bombardment of the wafer surface with ions from the plasma leads to removal of the surface material. The removal is markedly dependent on the angle of incidence of the ions on the surface. If the depression to be filled has a bottom running in the horizontal direction and side walls running in the vertical direction and if the boundary layer of the plasma runs parallel to the bottom, then material is removed primarily at the upper edge of the depression. The perpendicularly incident ions densify essentially only the material at the bottom, but drive out hardly any constituents and, on the other hand, owing to the glancing incidence on the side walls, can likewise drive out hardly any material there. In addition to anisotropic removal, it is known that the deposition of material also has a strongly directional component. Specifically, a large amount of material is deposited on areal sections which are oriented perpendicularly to the incident ion flow (bottom), whereas only a small amount of material is deposited on areal regions oriented parallel to the ion flow (side walls). This behavior is taken into account in previous literature models by the assumption of an angle-dependent adhesion coefficient for the depositing molecules (R. Conti et al. (IBM), DUMIC Conference 1999). Since this angle-dependent adhesion coefficient was only introduced empirically, this model cannot, in principle, make any predictions for the filling behavior under different process conditions (exception: ion energy or boundary layer voltage). Accordingly, previous improvements in the filling behavior are mainly based on trial and error.

One parameter which can be set during process control is the ion flow, that is to say the number of ions emerging from the boundary layer of the plasma per unit time. The ion flow depends to a good approximation only on the plasma density. However, the chemical reactions taking place within the plasma are dependent in a sensitive manner on the plasma density. Therefore, the plasma density must be kept within a comparatively small range of values. Otherwise, the quality of the deposited filling material does not satisfy contemporary requirements.

The second well-controllable parameter of the process is the boundary layer voltage, which is directly correlated with the kinetic energy of the individual ions. It is known that the boundary layer voltage should be optimized in such a way that, for a given composition and density of the plasma, on the one hand, a surface that is as planar as possible is produced after the depression has been filled and, on the other hand, effectively no material is removed at the opening edges of the depression, that is to say material removal due to ion bombardment and deposition of filling material approximately balance one another. If effective material removal were permitted, the structure whose depression is to be filled could be damaged.

SUMMARY OF THE INVENTION

The object of the present invention is to specify a method of the type mentioned in the introduction during the performance of which a further well-controllable process parameter is available and, if appropriate, is set. In particular, the intention is for it thus to be possible to fill depressions having large aspect ratios.

The object is achieved by means of methods having the features of claim 1 and of claim 6. The respective dependent claims relate to developments.

An essential concept of the present invention is that, in the region of the surface of the structure whose depression is to be filled, passivating substances or atomic and/or molecular particles are provided which can passivate the surface of the structure against addition of the filling material and/or of a precursor of the filling material. In this case, the invention is based on the insight that during the deposition of the filling material from the vapor phase, such passivation can occur, which can in turn be eliminated by bombardment with ions from the plasma. In this case, there is a pronounced dependence on the respective orientation direction of the surface of the structure, that is to say on the respective local normal to the surface. The ion rate or the ion flow onto a surface unit is greatest onto a surface oriented in the direction of the plasma boundary layer. If, by way of example, a structure is oriented in such a way that the bottom of the depression is oriented in the direction of the plasma boundary layer, then the ion flow onto a surface unit of the side walls of the depression is very much lower than onto the bottom. The passivating substance, on the other hand, acts virtually isotropically, in other words is not dependent on the orientation of the surface. Furthermore, it is also necessary to take account of the kinetics of the chemical reactions taking place. The invention now proposes not leaving to chance the fact of how many passivating particles are present, but rather influencing the degree of passivation (proportion of the passivating surface) in an orientation-dependent manner by way of the quantity of passivating particles that are present. It thus becomes possible to fill depressions in a targeted manner from the bottom and to minimize the deposition on the side edges of the depression.

The publication "Modeling of $SiO_2$ Deposition in High Density Plasma Reactors and Comparisons of Model Predictions with Experimental Measurements", Journal of Vacuum Science and Technology A 16(2), March/April 1998, 544 ff., by Ellen Meeks et al. (hereinafter referred to as Meeks for short), discloses results concerning the chemical reactions taking place during the deposition of $SiO_2$ in an HDP-CVD process. A main reaction route during the deposition of $SiO_2$ accordingly runs as follows: firstly, $SiH_x$, is added on the surface of the structure, where x denotes the numerals 2 and/or 3. Afterwards, the hydrogen ligands are partially oxidized. The surface molecule $SiG(OH)H_2$ is produced, where G denotes an oxygen atom common to two of the surface molecules. This surface molecule is chemically inert, so that further $SiH_x$ molecules cannot be added to it. Bombardment with ions from the plasma, in particular Ar ions, results in chemical activation, so that addition of further $SiH_x$ molecules can take place. This main reaction route is joined by diverse secondary reaction routes, for example the addition of oxygen and/or hydrogen-containing particles which effect the above-described passivation, that is to say passivate reactive surface locations. In this case, various passivation mechanisms are possible. By way of example, the passivating particles can form chemical bonds with surface molecules, thus cause free valence electrons to become bonding electrons and thereby prevent addition of $SiH_x$ molecules. Moreover, the passivating particles can also act obstructively on the restructuring processes which follow the above-described main reaction route and lead to the final formation of $SiO_2$ in the region of the surface. Thus, by way of example, an excessive supply of hydrogen causes the release of hydrogen that is necessary during the restructuring to be impeded or made more difficult.

In one embodiment of the invention, in addition to starting gases which are required for the deposition of the filling material a passivation gas is introduced into a reaction space of the process, constituents of the passivation gas passivating surface material of the structure against addition of the filling material and/or of a precursor of the filling material. In particular, the additionally introduced passivation gas may comprise at least one substance which also occurs in the starting gases. By way of example, it is known to introduce $SiH_4$, $O_2$ and Ar gas as starting gases during the deposition of $SiO_2$ in an HDP-CVD process. In this case, according to the invention, hydrogen gas, in particular, is additionally introduced as passivation gas. One development of the invention quite generally proposes that the passivation gas predominantly contains hydrogen and/or hydrogen molecules and/or water molecules if the filling material to be deposited has silicon oxide.

A refinement of the invention in which the filling material has silicon nitride proposes that the passivation gas predominantly has nitrogen and/or nitrogen molecules and/or compounds with nitrogen.

In addition to a good filling behavior there is also usually a demand for an essentially planar surface to be formed after the depression has been filled. To that end, it is known for the boundary layer voltage and thus the kinetic energy of the ions which are accelerated out of the plasma to be optimized in such a way that, on the one hand, an essentially planar surface is produced but, on the other hand, no disturbing effective material removal occurs due to the bombardment with ions ("ion etching"). As the aspect ratio increases, both aims may no longer be able to be achieved, depending on the circumstances. One development of the invention therefore proposes that the quantity of additionally introduced passivation gas is reduced after the depression has been at least partly filled. If appropriate, one or more other parameters of the process must likewise be changed after the depression has been partially filled, for instance the boundary layer voltage. As a result, firstly the deepest region of the depression can be filled in this way, but only inadequate planarization is achieved since material is also deposited outside the depression. After the process parameters have been changed, filling can then be effected in such a way that very good leveling is achieved. This is made possible by virtue of the fact that the aspect ratio has already been significantly reduced by the partial filling of the depression.

In one development of the invention, the structure depression to be filled is oriented in the direction of the boundary layer of the plasma. Furthermore, the ion rate is set in such as way that at the bottom of the depression, or generally at locations in the depression whose normals to the surface are oriented to the boundary layer, extensive depassivation occurs due to the ion bombardment, that is to say a further increase in the ion rate scarcely leads to a higher proportion of activated surface locations. By contrast (as already described) activation due to ion bombardment scarcely occurs in surface regions which are oriented transversely with respect to the direction of the plasma boundary layer. If the quantity or concentration of the passivating particles is increased, this at most has a slight effect in the surface regions oriented approximately in the direction of the plasma boundary layer, in particular at the bottom of the depression. This is because additional passivation is immediately eliminated again there due to ion bombardment. With increasing inclination of the normal to the surface relative to the direction of the plasma boundary layer, however, the ion rate per surface decreases and the additional passivation has an effect. Consequently, with the quantity or concentration of passivating particles, a process parameter is available which allows the addition of filling material and/or precursors of the filling material to be controlled in a direction-dependent manner.

In a further embodiment of the invention, which is based on the fact that constituents of a starting gas that is used for the deposition of the filling material passivate surface material of the structure against addition of the filling material and/or of a precursor of the filling material, it is proposed that the proportion of the starting gas in the gases involved in the process is greater than in the mixture ratio in which, under given fabrication parameters, (such as plasma density and boundary layer voltage) the greatest deposition rate of the filling material is attained. By way of example, $SiH_4$ (monosilane) gas is introduced into the reactor during the deposition of $SiO_2$, as already described. Hydrogen is therefore present in any case, which hydrogen can effect passivation of surface molecules. Furthermore, oxygen gas is introduced. A development of the invention in which the filling material has silicon oxide proposes that the quantitative ratio of oxygen molecules to silane molecules in the starting gases is set in such a way that it is more than 2.5:1, in particular more than 3:1.

In this embodiment, the quantity or the concentration of the passivating particles present in the region of the structure surface is thus set through the quantitative ratio of the starting gases which are required for the deposition of the filling material. It is surprising here that particularly good filling of depressions can be achieved beyond the quantitative ratio which leads to optimum layer growth. It has been assumed heretofore that filling of depressions having a high aspect ratio is made possible by virtue of the fact that removal of added material takes place at the edges of the depression due to ion bombardment. Accordingly, such depressions should be filled at the highest possible deposition rate. In actual fact, however, the surface chemistry, as already described, is crucial for the growth of the filling material.

The invention is not restricted to the aforementioned ways of setting the quantity or concentration of the passivating particles. It is quite generally a merit of the invention that a further process parameter is available whose variation can be used to control the direction-dependent growth. The last-mentioned procedure, according to which, in one embodiment of the invention, the proportion of a starting gas in the gases which participate in the process is greater than in the mixture ratio with the greatest deposition rate, is not, therefore, the only procedure. The mixture ratio of the starting gases can also be changed in another way, so that it lies outside the ranges previously regarded as suitable yet a good deposition behavior is nonetheless achieved.

BRIEF DESCRIPTION OF THE DRAWINGS

The invention will now be explained in more detail with reference to the accompanying drawing. In the figures of the drawing.

DESCRIPTION OF THE PREFERRED EMBODIMENT

Figure 1:
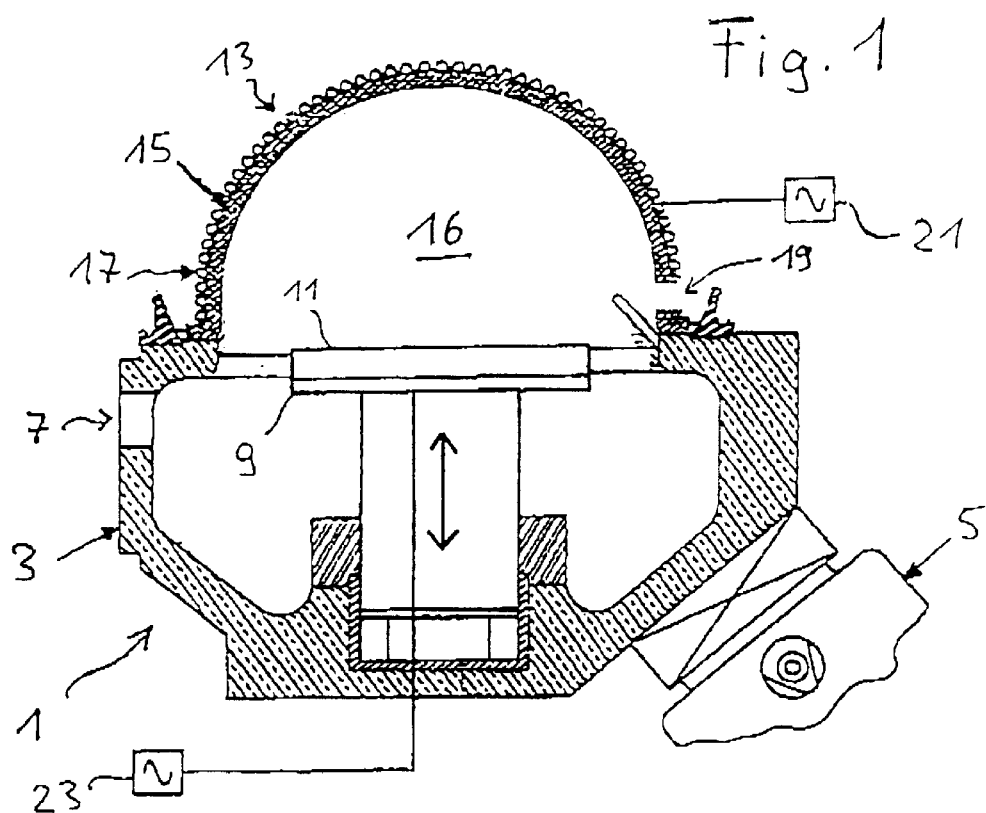
FIG. 1 shows a reactor in which an HDP-CVD process can be performed.
Figure 2:
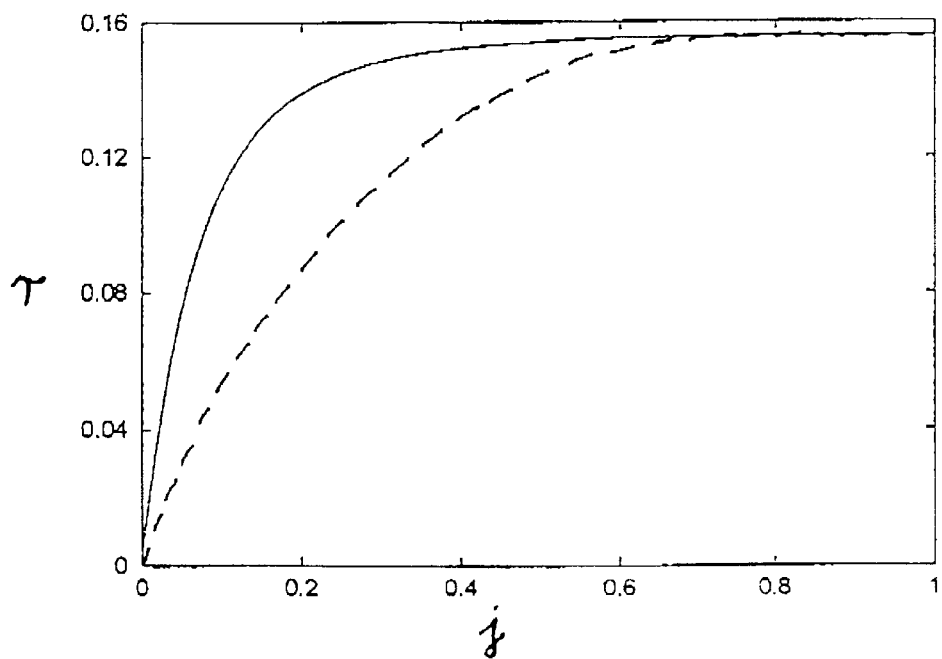
FIG. 2 shows a diagram in which a structure's surface proportion which is active for a chemical reaction is plotted against the ion flow onto the surface.

FIG. 2 illustrates the result of a simulation based on insights from the publication by Meeks (see above). In the diagram, the proportion r of reactive surface molecules is plotted against the ion flow j onto the surface in arbitrary units. In the scale of the ion flow j, the value 1 corresponds for example to the bottom of a depression whose normal to the surface is oriented to the boundary layer of the plasma in the plasma space 16 (FIG. 1). The value 0 is not reached at any location in the depression since an ion flow can be detected, for example on account of scattering effects, even at side walls of a depression which run in the direction of the plasma boundary layer. The chemical reactions—already described above—on the main reaction path and the secondary reaction paths of the deposition of $SiO_2$ in an HDP-CVD process have been taken into account, inter alia, in the simulation. The solid line reveals that the reactive surface proportion r does not depend on the ion flow j approximately in the range $0.6 \leq j < 1$. Furthermore, the reactive surface proportion r depends nonlinearly on the ion flow j in the range $0.1 \leq j < 0.4$. If the quantity or concentration of passivating particles is then increased in the region of the surface of the structure, the dependence represented by the dashed curve is produced. The change can be explained qualitatively by the fact that in the range $0.7 \leq j < 1$, each passivated surface molecule continues to be activated due to ion bombardment, whereas additional passivation otherwise occurs. The consequence is that filling material can continue to be deposited at the same deposition rate on the bottom, but significantly less material is deposited on the side walls. The deposition rate is thus lower overall. However, the desired direction-selective deposition takes place, which allows depressions having a high aspect ratio to be filled.

Figure 3:
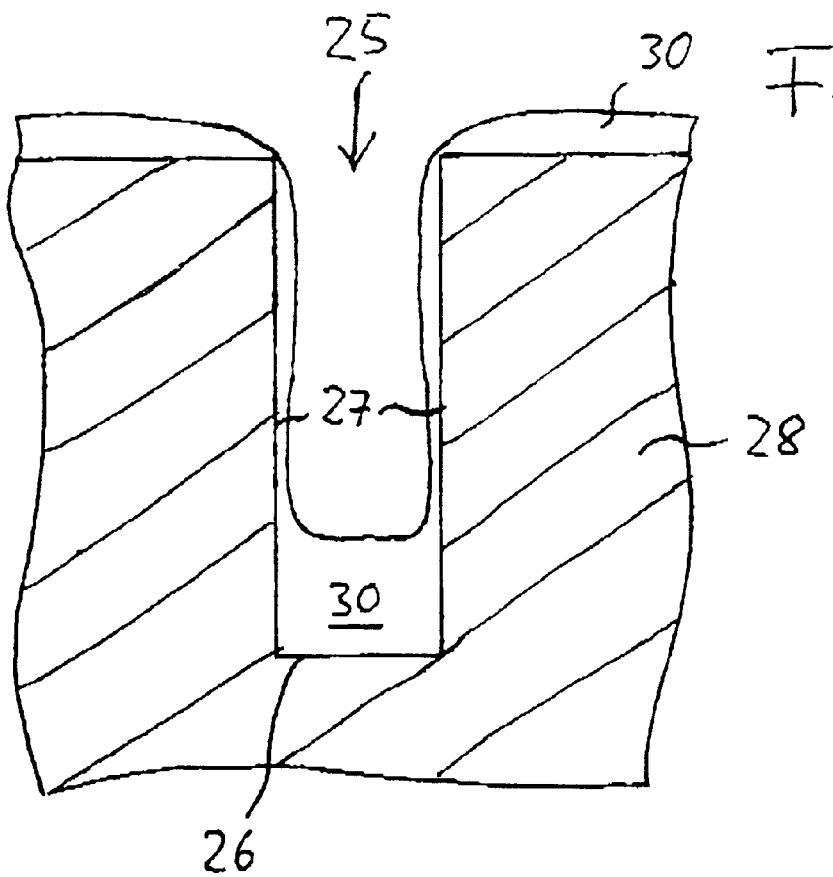
FIG. 3 shows a depression in a structure which is filled in an HDP-CVD process.

FIG. 3 shows a microtechnical structure 28 having a trench 25 extending perpendicularly to the plane of the picture. The trench 25 has already been partly filled with a filling material, silicon oxide 30 here, from the bottom 26. Silicon oxide 30 has also been deposited on the side walls 27 of the trench 25. Furthermore, deposition of silicon oxide 30 has also taken place outside the trench 25. The trench 25 originally had an aspect ratio of 3.

Figure 4:
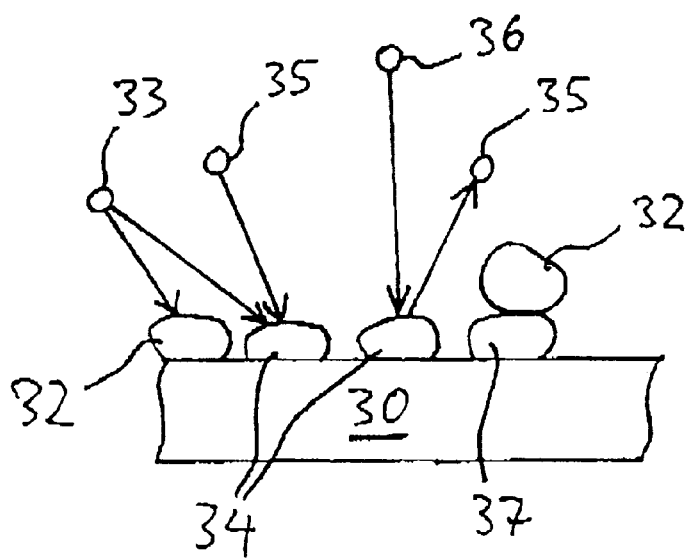
FIG. 4 shows an abstracted illustration of chemical and physical processes during the deposition of material on a surface of a structure.

The deposition of the silicon oxide 30 is carried out for example in the reactor 1 already described with reference to FIG. 1. In this case, the processes described below with reference to FIG. 4 take place, inter alia:

$SiH_x$ molecules 32 (x=2, 3) or SiO molecules are added on the surface of the silicon oxide 30 that has already been deposited. The $SiH_x$ molecule 32 illustrated in the left-hand part of the figure is reactive, so that one or more oxygen particles 33 are added to it from the vapor phase. A molecule 34 is thus produced, for instance an $SiG(OH)H_2$ molecule, where G denotes an oxygen atom common to a further such or different molecule. The molecule 34 is then exposed to a series of possible chemical and physical processes. Thus, by way of example, an Ar ion 36 from the direction of the plasma boundary layer can act on the molecule 34 and activate it. The activation may consist for example in the removal of a hydrogen atom 35. As an alternative, the impingement of the Ar ion 36 may also effect an energetically excited state which, in turn, can lead to restructuring of the composite of the molecule 34 with its adjacent molecules. The addition of oxygen particles 33 and/or hydrogen atoms 35 or else of other particles may lead to renewed passivation. On account of the ion bombardment, however, a proportion of activated molecules 37 is available which enables further addition of $SiH_x$ molecules 32.

By increasing the quantity or concentration of passivating particles, the trench 25 of the structure 28 (FIG. 3) is filled without the formation of voids. In order, at the same time, also to achieve good planarization of the surface of the structure after filling, the boundary layer voltage is optimized. The optimum value is somewhat greater than in the case of a smaller quantity of passivating particles.

When selecting the passivating gas which is introduced into the reactor 1 in accordance with one embodiment of the invention, care is preferably taken to ensure that no chemical processes take place other than the ones that would take place without the introduction of the additional passivation gas. Only the quantitative ratios of the constituents of the introduced gases are influenced. The advantage of this procedure is that it can be linked directly to already known, optimized fabrication processes and it is not necessary firstly for completely new processes to be developed in costly series of experiments. The previously known process parameters and their values can largely be adopted. Through the quantity of passivating particles, it is merely the case that a further parameter is available.

We claim:

1. In a method for fabricating a microtechnical structure including depositing a filling material in at least one depression in a structure using an HDP-CVD process, the improvement which comprises:

including silicon oxide in the filling material;

introducing, in addition to silane ($SiH_4$) and oxygen ($O_2$) as starting gases required for depositing the filling material, a passivating gas into a reaction space of the process, and thereby passivating surface material of the structure against addition of one of the filling material and a precursor of the filling material with constituents of the passivating gas; and adjusting the passivating gas to predominantly contain materials selected from the group consisting of hydrogen, hydrogen molecules, and water molecules.

2. The method according to claim 1, wherein the passivating gas comprises at least one substance that also occurs in the starting gases.

3. The method according to claim 1, which comprises, after the depression has been at least partly filled, reducing a quantity of additionally introduced passivating gas.

4. The method according to claim 1, which comprises forming the microtechnical structure as a microelectronic structure.

5. In a method for fabricating a microtechnical structure including depositing a filling material in at least one depression in a structure with an HDP-CVD process, the improvement which comprises:

including silicon nitride in the starting material;

introducing, in addition to starting gases required for depositing the filling material, a passivating gas into a reaction space of the process, and thereby passivating surface material of the structure against addition of one of the filling material and a precursor of the filling material with constituents of the passivating gas;

including at least one substance also occurring in the starting gases in the passivating gas; and adjusting the passivating gas to predominantly contain at least one of nitrogen and nitrogen molecules.

6. The method according to claim 5, which comprises, after the depression has been at least partly filled, reducing a quantity of additionally introduced passivating gas.

7. The method according to claim 5, which comprises forming, the microtechnical structure as a microelectronic structure.

8. A method for fabricating a microtechnical structure, which comprises:

depositing a filling material containing silicon oxide in a depression in the structure with an HDP-CVD process;

passivating surface material of the structure against addition of one of the filling material and a precursor of the filling material with a passivating gas, the passivating gas including constituents of a starting gas used for depositing the filling material and the gasses selected from the group consisting of hydrogen, hydrogen molecules, and water molecules;

providing oxygen as a first starting gas and silane as a second starting gas; in the passivating gas, adjusting a proportion of the starting gas involved in the process to be greater than in a mixture ratio in which, under given fabrication parameters, a greatest deposition rate of the filling material is attained.

9. The method according to claim 8, which further comprises providing the oxygen and the silane at a quantitative ratio of oxygen molecules to silane molecules in the starting gases to more than 2.5:1.

10. The method according to claim 9, which comprises adjusting the ratio to more than 3:1.

11. The method according to claim 9, which comprises selecting monosilane as the second starting gas.

12. The method according to claim 8, which comprises reducing a proportion of the starting gas after the depression has been at least partly filled.

13. The method according to claim 8, which comprises setting an aspect ratio of the depression to exceed 2.

14. The method according to claim 7, which comprises setting an aspect ratio of the depression to exceed 3.

15. The method according to claim 1, which comprises forming the microtechnical structure as a microelectronic structure.

* * * * *